United States Patent
Kurimoto

[11] Patent Number: 6,043,004
[45] Date of Patent: Mar. 28, 2000

[54] ASHING METHOD

[75] Inventor: Takashi Kurimoto, Aichi, Japan

[73] Assignee: Fujitsu Limited, Kawasaki, Japan

[21] Appl. No.: 09/041,676

[22] Filed: Mar. 13, 1998

[30] Foreign Application Priority Data

Sep. 19, 1997 [JP] Japan .................................. 9-255564

[51] Int. Cl.[7] ...................................................... G03F 7/36
[52] U.S. Cl. ......................... 430/329; 438/715; 438/725; 438/726
[58] Field of Search ........................... 430/329; 438/715, 438/725, 726

[56] References Cited

U.S. PATENT DOCUMENTS

| | | | |
|---|---|---|---|
| 4,511,430 | 4/1985 | Chen | 156/643 |
| 5,226,056 | 7/1993 | Kikuchi et al. | 373/18 |
| 5,503,964 | 4/1996 | Nishina | 430/329 |
| 5,795,831 | 8/1998 | Nakayama et al. | 438/714 |
| 5,811,358 | 9/1998 | Tseng | 438/725 |

FOREIGN PATENT DOCUMENTS

| | | |
|---|---|---|
| 1-117033 | 5/1989 | Japan . |
| 2-183524 | 7/1990 | Japan . |
| 4-286317 | 10/1992 | Japan . |
| 5-291129 | 11/1993 | Japan . |
| 7-86146 | 3/1995 | Japan . |
| 8-69896 | 3/1996 | Japan . |
| 8-288260 | 11/1996 | Japan . |
| WO 97/04476 | 2/1997 | WIPO . |

*Primary Examiner*—Sharon Gibson
*Assistant Examiner*—Nicole Barreca
*Attorney, Agent, or Firm*—Armstrong, Westerman, Hattori, McLeland & Naughton

[57] ABSTRACT

The ashing method comprises the steps of forming resist on a part of an underlying layer, ion-implanting elements into the underlying layer and the resist, placing the resist in radical atmosphere including oxygen radical and then ashing an upper layer portion which includes the impurity elements and is formed an a surface of the resist, and ashing remaining portion of the resist by increasing an amount of the oxygen radical in the radical atmosphere.

13 Claims, 6 Drawing Sheets

(1) THE μ WAVE POWER IS 1000W + REACTION HEAT ENERGY
(2) THE μ WAVE POWER IS 1500W + REACTION HEAT ENERGY
(3) THE WAFER IS PLACED ON THE STAGE IN VACUUM WITHOUT THE μ WAVE

ASHING METHOD

BACKGROUND OF THE INVENTION

1. Field of the Invention

The present invention relates to an ashing method and, more particularly, an ashing method of ashing resist by use of oxygen.

2. Description of the Prior Art

At present, miniaturization of a semiconductor integrated circuit is rapidly being progressed and also a semiconductor wafer used for forming the semiconductor integrated circuit is being increased in size. A lithography technique is indispensable for fabricating the semiconductor integrated circuit. In general, a mask which is formed by coating, exposing, and developing resist is employed in the lithography technique. In addition to the lithography technique, the mask made of the resist may be employed to implant the impurity into predetermined areas of a semiconductor layer.

Since the resist is removed in a final stage of the lithography step or the ion-implantation step, a technique which can mate with the miniaturization and the high integration degree of the semiconductor integrated circuits is needed as a resist removing method. For example, improvement in ashing uniformity, improvement in high ashing selectivity with respect to a thin film as an etching object, prevention of damage of the substrate, high cleanliness, high throughput, etc. are requested.

For this reason, techniques which are able to reduce damages of the substrate and the film, reduce residues and particles after ashing, and increase throughput of the ashing process are needed in ashing.

Meanwhile, if an N well and a P well are formed in one silicon substrate, p-type impurity and n-type impurity are separately implanted while covering respective parts of the silicon substrate with the resist mask. In the step of forming MOS transistors in the N well and the P well respectively, the p-type impurity and the n-type impurity are ion-implanted selectively into the N well and the P well while covering one of the N well and the P well with the resist mask since different impurities are to be implanted into the N wells and the P wells respectively. There are phosphorus, arsenic, etc. as the n-type impurity, for example, and there are boron, etc. as the p-type impurity, for example.

In the event that a dosage of the p-type impurity or the n-type impurity is enhanced in such ion-implantation, a deteriorated layer is formed on a surface of the resist film because of introduced impurity. Because such deteriorated layer is difficult to be removed by the ordinary method, a special method must be employed. Generation of the deteriorated layer has been set forth in articles, for example, Shuzo FUJIMURA et al., JAPAN JOURNAL OF APPLIED PHYSICS, VOL. 28, NO. 10, October 1989, pp. 2130–2136, and K. Shinagawa et al., DPS 1992, pp.75–80. The deteriorated layer is generated when a dosage is increased higher than about $5 \times 10^{15}$ atoms/cm$^2$.

As the ashing method, there are a wet ashing method and a dry ashing method. The wet ashing is preferable in that there is no damage to the substrate and the film, but a chemicals bath is contaminated every ashing process and the particles introduced into the chemicals bath are adhered again to the substrate and the film.

As the dry ashing method, there is a method of exposing directly the resist to plasma by use of the ashing equipment shown in FIG. 1, for example.

FIG. 1 shows a dry etching equipment having a configuration in which the deteriorated layer of the resist is directly exposed to plasma. In FIG. 1, a gas supply pipe 2 is provided on an upper portion of a chamber 1 of the ashing equipment. A gas shower plate 3 having plenty of holes is then fitted to an lower end of the gas supply pipe 2 to be directed to a substrate stage 4. A high frequency power supply 5 is then connected to the substrate stage 4. Exhaust ports 6 are then provided on a bottom portion of the chamber 1.

In order to execute the ashing of the resist, a pressure in an interior of the chamber 1 is reduced, then a high frequency voltage is applied to the substrate stage 4, and then the substrate W on which the resist having the deteriorated layer thereon is formed is placed on the substrate stage 4. When an oxygen mixed gas is supplied into the chamber via the gas supply pipe 2 and the gas shower plate 3, plasma such as oxygen plasma is generated between the gas shower plate 3 and the substrate stage 4. As a result, the deteriorated layer of the resist is exposed to the oxygen plasma and then removed.

Not only the resist and the deteriorated layer but also the substrate W and the film formed on the substrate W are exposed to the plasma in the ashing process. Therefore, there has been such a problem that the substrate W and the film are damaged by ions in the plasma.

On the contrary, as disclosed in Patent Application Publication (KOKAI) 4-286317, Patent Application Publication (KOKAI) 8-288260, and Patent Application Publication (KOKAI) 8-69896, there are methods in which the deteriorated layer of the resist is removed by ion and the undeteriorated layer is ashed by the radical. However, since these techniques employ ions in removing the deteriorated layer, merely such an advantage can be expected that an influence of damage onto the substrate and the film caused by ions is reduced.

As the dry ashing method, a downflow ashing method in which ashing is carried out with the use of radical of the reaction gas including reduced ions has been set forth in Patent Application Publication (KOKAI) 7-86146.

According to the ashing method using the radical in the prior art, if a power of the microwave to generate the plasma is increased in order to enhance a resist removing rate (ashing rate), a part of the deteriorated layer has remained on the substrate and therefore the deteriorated layer has not been able to be removed completely.

According to the downflow ashing method in the prior art, if the substrate temperature is increased more than 150° C. in order to enhance the ashing rate, resist burst is generated to thus contaminate the chamber. The resist remained in the chamber causes generation of the particles and also causes the residue of resist on the substrate. In general, such resist burst is called a "pumping phenomenon" and has a bad influence upon the throughput.

SUMMARY OF THE INVENTION

It is an object of the present invention to provide an ashing method capable of improving a throughput to suppress generation of particles without damage of a substrate.

According to the present invention, the deteriorated layer (impurity including layer) formed on the surface of the resist can be ashed by reduced oxygen radical, and then remaining portion of the resist can be ashed by increased radical.

The ashing of the deteriorated layer can be facilitated if the deteriorated layer is ashed by reduced oxygen radical. The reason for this may be considered as follows.

In general, an ashing rate of the resist into which impurity such as phosphorous, arsenic, boron, or the like is injected becomes higher as an amount of the oxygen radical is much more increased.

However, the deteriorated layer is formed on the surface of the resist into which the impurity is injected at a high dosage. Thus, if a large quantity of oxygen radical is supplied to the deteriorated layer, oxidation of the impurity in the deteriorated layer is accelerated to thus produce the oxide. It may be guessed that the oxide has a property to suppress the ashing of resist component. For this reason, if the deteriorated layer is ashed by reduced oxygen radical, oxidation of the deteriorated layer can be suppressed so that ashing of the resist component can be accelerated and thus the deteriorated layer can be easily removed.

After the deteriorated layer formed on the surface of the resist has been removed, there is no need to consider oxidation of the impurity. Hence, an amount of the oxygen radical can be increased and thus the remaining portion of the resist can be removed at a higher ashing rate. As a result, throughput of the ashing can be improved.

If the temperature of the resist is suppressed lower to ash the deteriorated layer formed on the surface of the resist, the pumping phenomenon is not caused. Hence, the number of particles and the amount of residue after the ashing can be extremely reduced. In other words, the pumping of the resist is not caused because of difference in radical amount, but it is caused because of resist burst of the undeteriorated layer, which is surrounded by the deteriorated layer formed as the upper layer portion of the resist, caused when the substrate temperature is increased up to the predetermined temperature. Therefore, the deteriorated layer must be ashed at the lower substrate temperature not to cause the pumping, for example, less than 150° C.

Since the amount of oxygen radical can be varied in the same chamber, throughput of the ashing process is in no way degraded. In addition, if overall resist is ashed by the oxygen radical without the cation and the electron, the underlying layer is never damaged by the ashing.

As means for increasing the amount of the oxygen radical, there may be thought of a method of increasing the microwave power used to generate the plasma, a method of increasing the flow rate of the gas introduced into the plasma generating chamber, and a method of increasing the pressure of the radical atmosphere.

DESCRIPTION OF THE PREFERRED EMBODIMENT

An embodiment of the present invention will be explained with reference to accompanying drawings in detail hereinafter.

Figure 1:
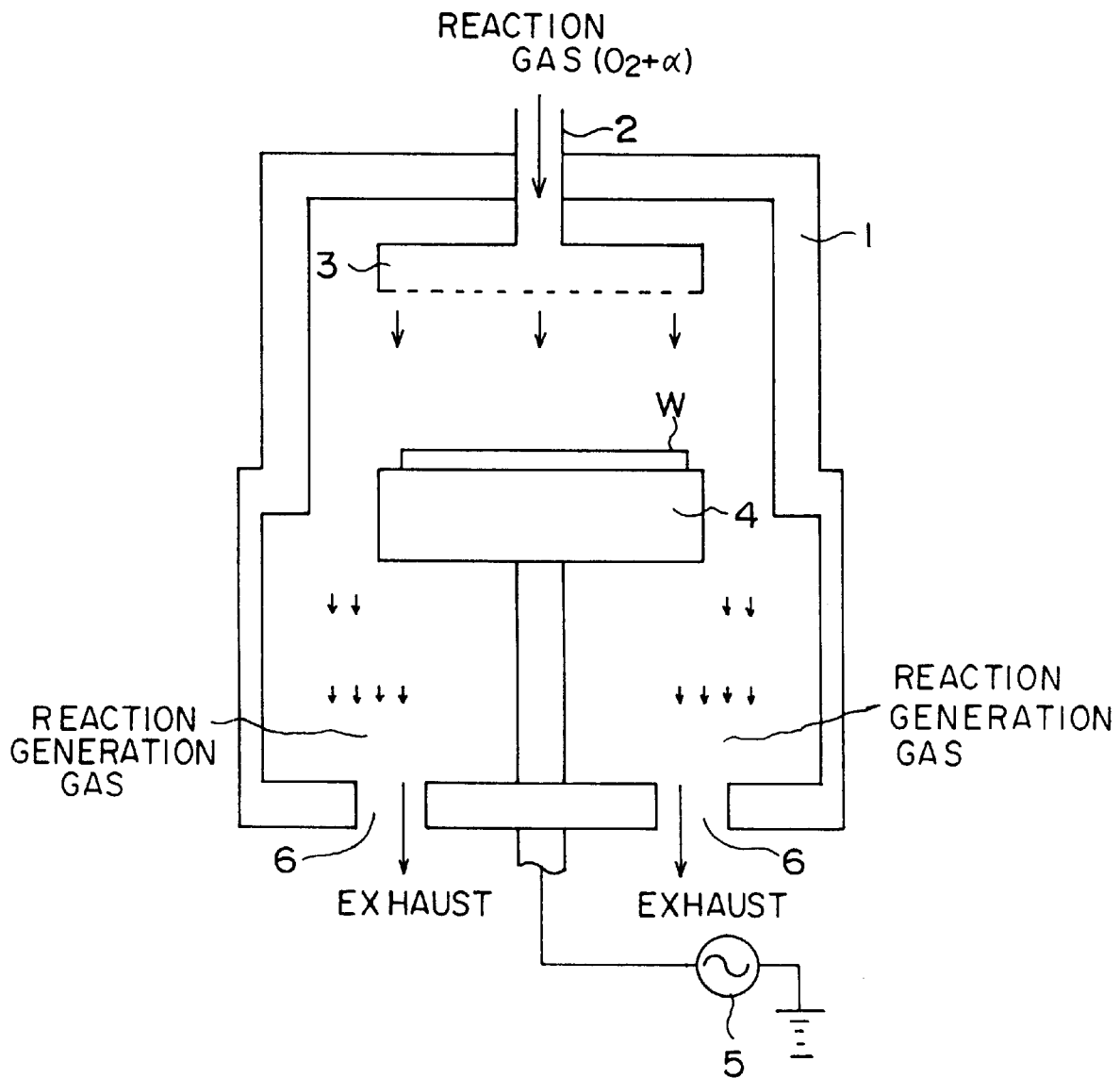
FIG. 1 is a schematic sectional view showing a plasma ashing equipment in the prior art.
Figure 2:
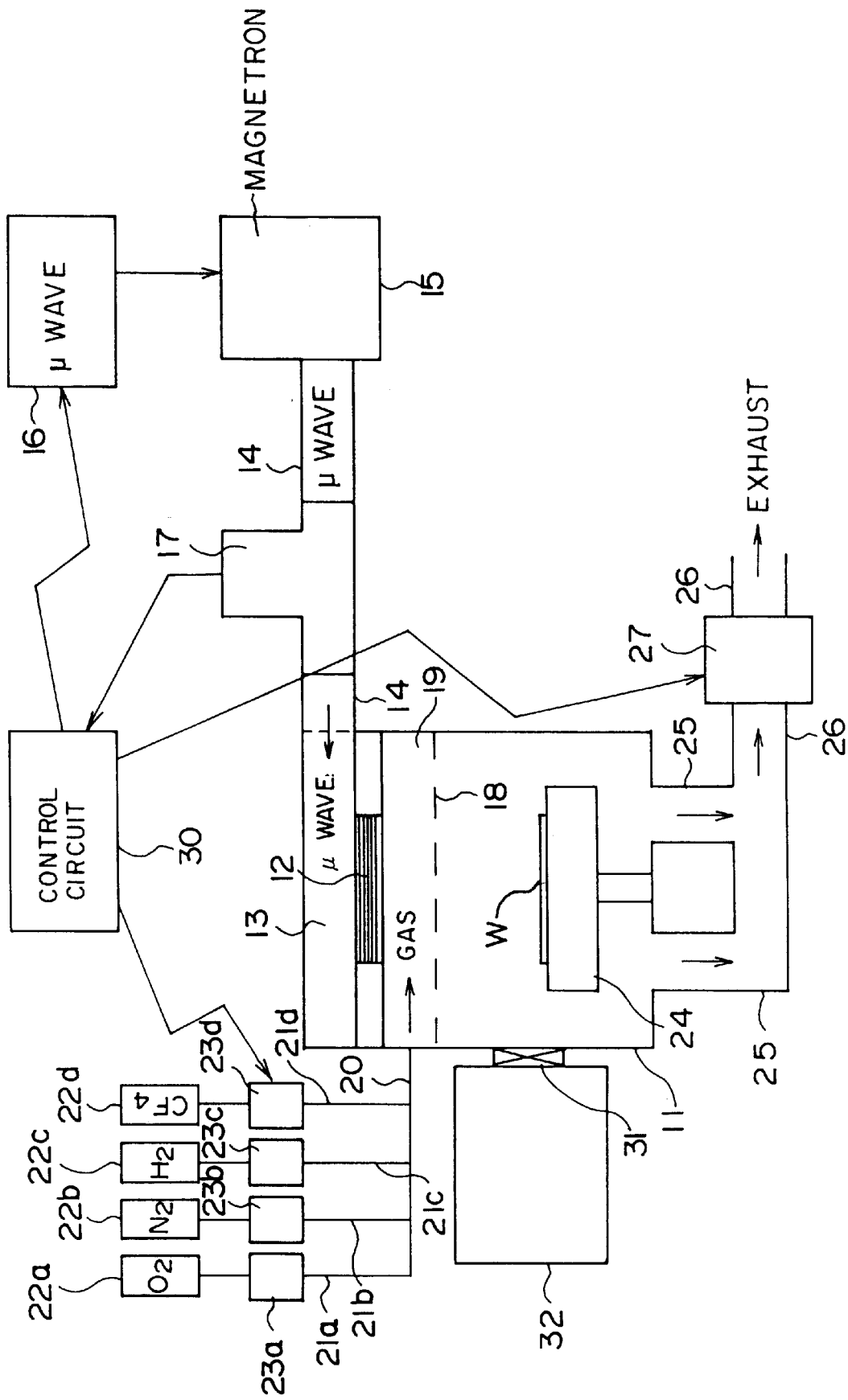
FIG. 2 is a schematic view showing a configuration of an ashing equipment used in an embodiment of the present invention.
Figure 3:
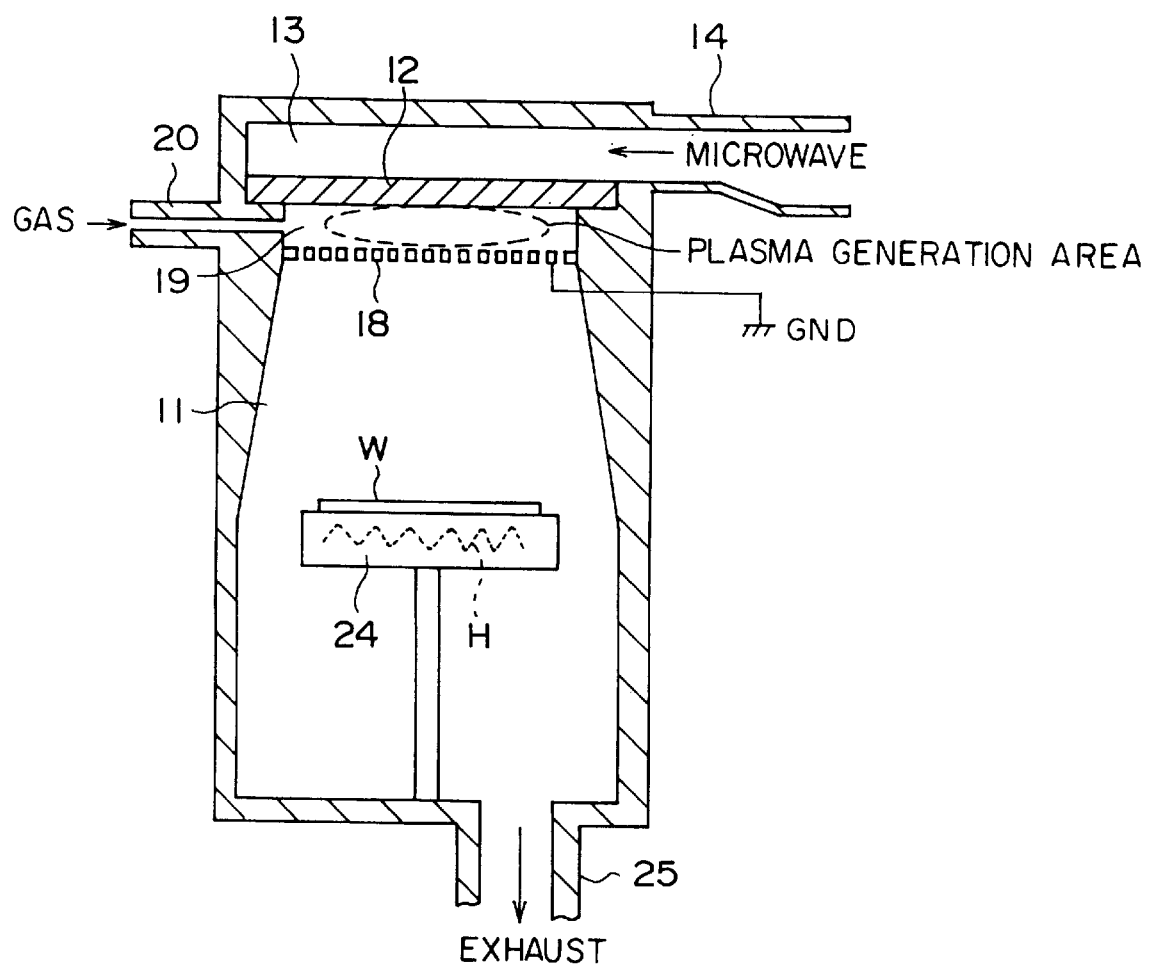
FIG. 3 is a sectional view showing an example of a reaction chamber of the ashing equipment shown in FIG. 2.

FIG. 2 is a schematic view showing a configuration of an ashing equipment used in an embodiment of the present invention. FIG. 3 is a sectional view showing a reaction chamber of the ashing equipment shown in FIG. 2.

The ashing equipment shown in FIGS. 2 and 3 is downflow type one, and a microwave introducing chamber 13 is provided over a reaction chamber 11 and a microwave transmitting window 12 made of quartz is provided below the chamber 13 to separate them. A circular quartz having a diameter of 90 mm, for example, is employed as the microwave transmitting window 12.

A microwave waveguide 14 is connected to the microwave introducing chamber 13. The microwave waveguide 14 introduces the microwave ($\mu$ wave) generated by a magnetron 15 into the microwave introducing chamber 13. A power of microwave generated by the magnetron 15 can be adjusted by a microwave power supply 16 connected to the magnetron 15. An autotuner 17 is fitted to the microwave waveguide 14 such that the power of the microwave propagated through the microwave waveguide 14 can be measured by the autotuner 17.

A plasma generating chamber 19 is provided below the microwave transmitting window 12 in the reaction chamber 11 by partitioning the reaction chamber 11 by means of a conductive shower plate 18 having plenty of holes. A gas introducing pipe 20 is connected to a plurality of gas supply sources 22a to 22d via a manifold. Flow rates of gases passing through branch pipes 21a to 21d of the manifold can be adjusted by mass flow controllers 23a to 23d respectively.

The reaction gas which is introduced into the plasma generating chamber 19 via the gas introducing pipe 20 can be plasmanized by the microwave which is transmitted through the microwave transmitting window 12. Because cations and electrons in the plasma are captured or trapped by the grounded shower plate 18, only neutral active species (radical) can be discharged downward from the holes of the shower plate 18.

A wafer stage 24 with a built-in heater H is fitted below the shower plate 18 in the reaction chamber 11. A plurality of exhaust ports 25 are provided in the bottom portion located at a further lower position. A pressure in an inside of the reaction chamber 11 can be reduced by an exhaust pump (not shown) which is connected to the exhaust ports 25 via an exhaust pipe 26. The pressure in the inside of the reaction chamber 11 can be adjusted by an auto pressure controller 27 fitted to the exhaust pipe 26.

The flow rate of the gas by respective mass flow controllers 23a to 23d, the power of the microwave power supply 16, the temperature of the wafer stage 24, and the exhaust gas from the auto pressure controller 27 can be adjusted by a control circuit 30 respectively. In other words, the flow rate of the gas supplied from respective gas sources 22a to 22d, flow rate ratio of the gas supplied from respective gas sources 22a to 22d in the reaction chamber 11, or a total flow rate of the gas in the reaction chamber 11 can be adjusted by controlling the mass flow controllers 23a to 23d by virtue of the control circuit 30. In addition, an output of the microwave power supply 16 can be adjusted by the control circuit 30 based on a detection value of the microwave power obtained by the autotuner 17. Furthermore, the temperature of the wafer stage 24 can be controlled by the control circuit 30. Moreover, the pressure in the reaction chamber 11 can be controlled by the auto pressure controller 27 in compliance with an instruction from the control circuit 30 based on a measured value of a pressure gauge (not shown). Thus, an adjustment of exhaust conductance can be executed.

Figure 4:
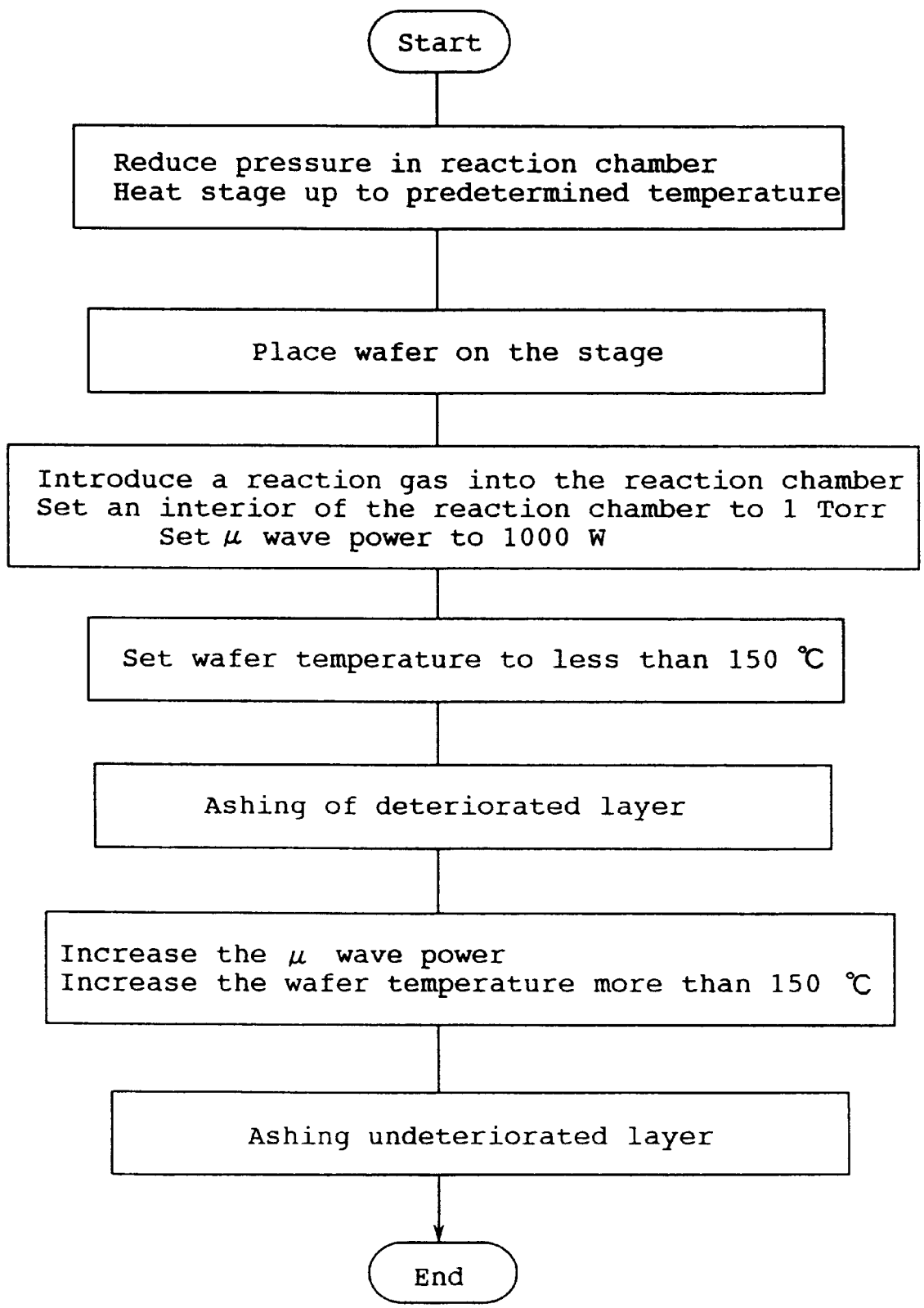
FIG. 4 is a flowchart illustrating an operation of the ashing equipment shown in FIG. 2.

A program for executing a flowchart shown in FIG. 4, for example, is installed onto the control circuit 30.

When a gate valve 31 is opened, the wafer W can be transferred from a load/unload chamber 32 to the reaction chamber 11.

Subsequently, a method of ashing the resist having the deteriorated layer portion by use of the above ashing equipment will be explained hereunder.

Figure 5A:
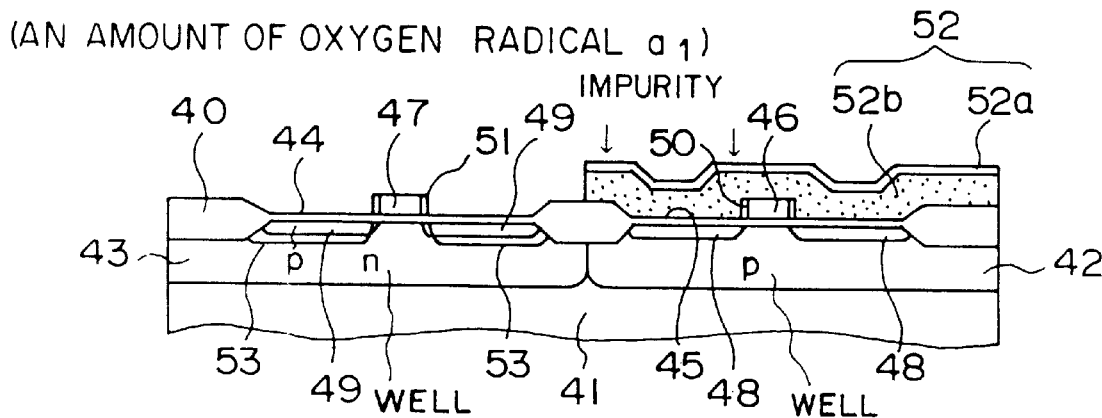
FIGS. 5A to 5C are sectional views showing a step of forming a deteriorated layer of resist and a step of ashing a resist layer used in manufacturing processes of a semiconductor device.
Figure 5B:
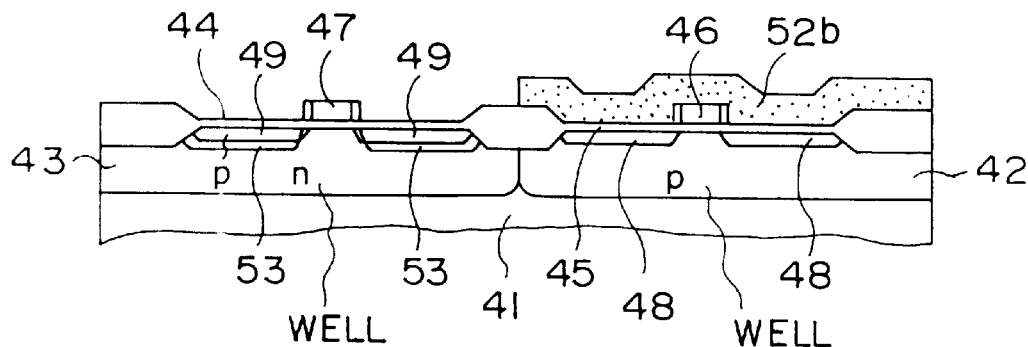
Figure 5C:
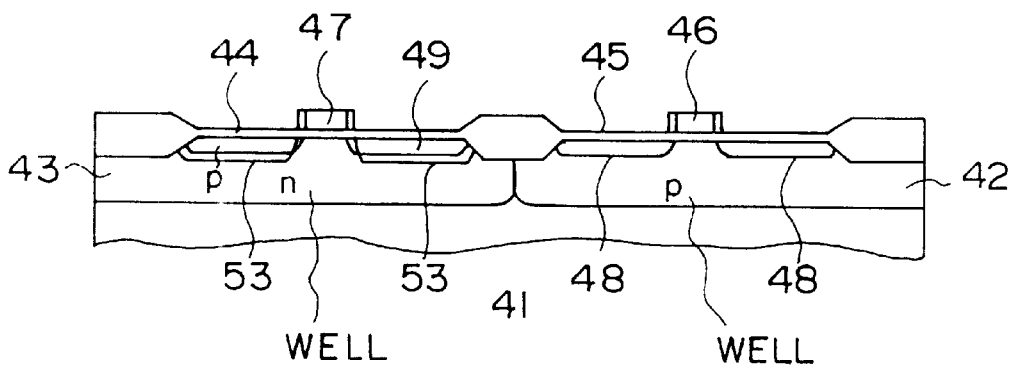

The resist is used in the impurity injecting step to form the semiconductor device as shown in FIGS. 5A to 5C, for example.

In FIG. 5A, a P well 42 and an N well 43 are formed respectively in a semiconductor substrate 41 made of silicon. Gate electrodes 46, 47 are formed on the P well 42 and the N well 43 via insulating layers 45, 44 respectively. N-type low concentration impurity diffusion layers 48 are formed on both sides of the gate electrode 46 in the P well 42 in a self-alignment manner. Similarly, p-type low concentration impurity diffusion layers 49 are formed on both sides of the gate electrode 47 in the N well 43 in the self-alignment manner. In addition, insulating side walls 50 are formed on the gate electrode 46, and also insulating side walls 51 are formed on the gate electrode 47.

Device isolation layers 40 made of $SiO_2$ are formed on the N well 43 and the P well 42.

The resist 52 covers the gate electrode 46, the n-type impurity diffusion layer 48, etc. on the P well 42. Under this condition, when p-type impurity is ion-implanted into the N well 43 at a dosage of more than $5\times10^{15}$ atoms/cm$^2$ to form high concentration impurity diffusion layers 53, an deteriorated layer 52a is formed on an upper layer portion of the resist 52. In this case, if a thickness of the resist 52 is set to 1.2 $\mu$m, the deteriorated layer 52a is formed as the upper layer portion of the resist 52 to have a thickness of about 200 to 300 nm.

Next, the step of ion-implanting the n-type impurity into the P well 42 will be explained, but the resist 52 must be removed by the ashing equipment before such step.

The ashing process is executed along procedures given in a flowchart shown in FIG. 4. First the pressure of the interior of the reaction chamber 11 is reduced and then the wafer stage 24 is heated up to the temperature of 200° C., for example. In turn, the semiconductor substrate 41 is carried into the reaction chamber 11 through the load/unload chamber 32 to be placed on the wafer stage 24. Immediately after this placement, a gate valve 31 is closed.

The reaction gas is introduced into the reaction chamber 11 immediately after the placement of the semiconductor substrate 41 has been finished, then the pressure in the reaction chamber 11 is adjusted to 1 Torr, for example, and then a power of microwave in the microwave introducing chamber 13 is set low to about 1000 W, for example, by adjusting the microwave power supply 16.

As the reaction gas, a mixed gas of oxygen ($O_2$), nitrogen ($N_2$), hydrogen ($H_2$) and carbon tetrafluoride ($CF_4$) can be used. Flow rates of various gases can be adjusted by the mass flow controllers respectively. For example, the $O_2$ gas is set to 955 sccm, the $N_2$ gas is set to 485 sccm, the $H_2$ gas is set to 15 sccm, the $CF_4$ gas is set to 45 sccm. Such pressure adjustment in the reaction chamber 11, supply of the reaction gas, and adjustment of the microwave power can be carried out easily in a short time.

Figure 6:
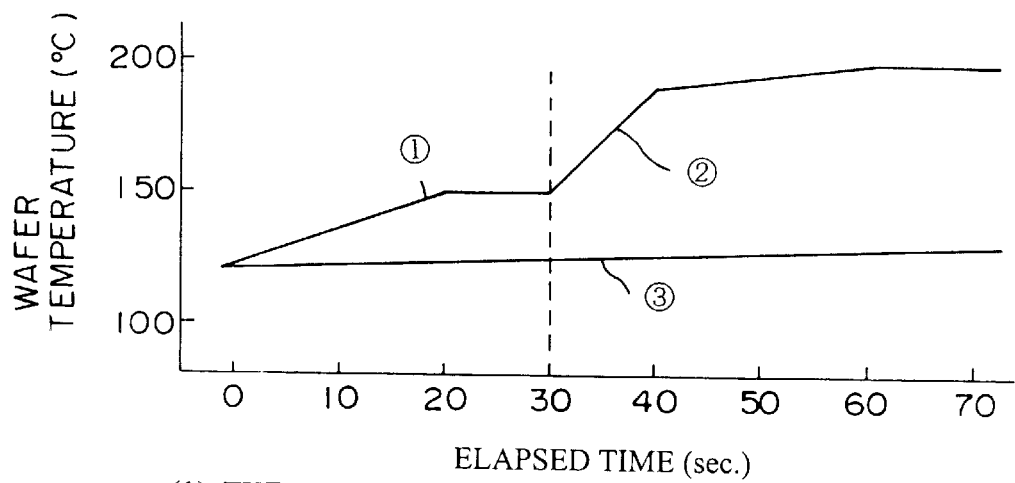
FIG. 6 is a graph showing relationships between change in a substrate temperature and an ashing elapsed time in the ashing process of the resist with the use of the ashing equipment shown in FIG. 2.

As shown in FIG. 6, the temperature of the semiconductor substrate 41 is below about 150° C. immediately after the substrate 41 is placed on the wafer stage 24 and thereafter it is gradually increased. After a predetermined time has elapsed, the temperature of the semiconductor substrate 41 is saturated at 150° C.

It has become obvious empirically that, under such conditions of the substrate temperature and the microwave power, the deteriorated layer 52a of the resist 52 can be removed and, as shown in FIG. 5B, an undeteriorated layer 52b of the resist 52 can be exposed.

Subsequently, as shown in FIG. 6, the temperature of the semiconductor substrate 41 is increased gradually up to about 200° C. by increasing the microwave power up to 1500 W such that it becomes substantially equal to the wafer stage 24. Under these conditions, oxygen radical is increased and therefore an ashing rate is enhanced to 2 to 3 $\mu$m/min. It has also become obvious empirically that, at the time when 30 to 50 seconds or less has elapsed from start of either increase of the microwave power or increase of the substrate temperature, the remaining undeteriorated layer 52b of the resist 52 can be removed completely, as shown in FIG. 5C. A timing of such increase of the microwave power or increase of the substrate temperature should be set with regard to the thickness of the deteriorated layer after the ashing rate of the deteriorated layer has been checked in advance. Unless the microwave power or the substrate temperature is increased, the ashing rate is lowered and the throughput is reduced.

With the above, the ashing process of the resist 52 has been completed, and therefore supply of the reaction gas and introduction of the microwave are terminated.

Meanwhile, if removal of the deteriorated layer 52a is executed at the substrate temperature of less than 150° C., the pumping phenomenon is not caused. As a result, generation of the resist residue and the particles due to the pumping phenomenon can be prevented.

Figure 7:
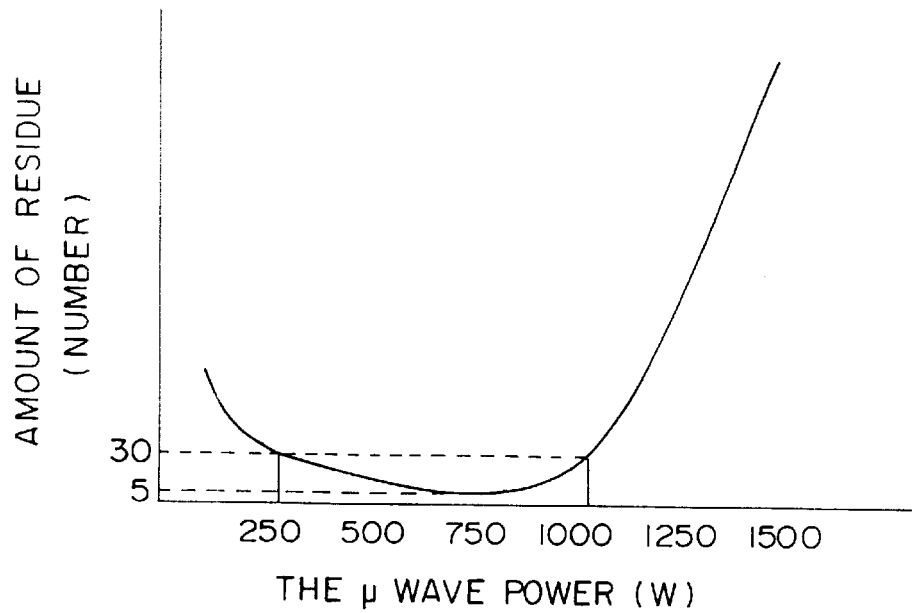
FIG. 7 is a graph showing a relationship between an amount of ashing residue and a microwave power used to execute ashing of the resist having the deteriorated layer.

Next, using the semiconductor substrate 41 having a diameter of 8 inch, the experiment for removing the deteriorated layer according to the above method has been repeated to examine a relationship between the number of particles remained on the semiconductor substrate 41 and the microwave power. Then, the result shown in FIG. 7 can be obtained.

In the manufacturing steps of the semiconductor device, it is in general requested that the number of particles generated by the ashing should be suppressed below thirty. In order to satisfy this condition, according to FIG. 7, the microwave power required for ashing the deteriorated layer can be deduced in the range of 250 to 1100 W. In addition, in case the microwave power is about 750 W, residue of the particles can be reduced to the lowest.

Normally the microwave generating power is set to about 1500 W. If the power is reduced lower than about 1500 W, an amount of the oxygen radical can be reduced. Hence, it should be noted that such reduction of power is effective to removal of the deteriorated layer.

In ashing the undeteriorated layer of the resist, there is no necessity of considering the pumping phenomenon, generation of the residue, and generation of the particles. Especially, it is preferable that the microwave power is made higher to increase an amount of the oxygen radical so that the ashing rate is increased higher. As a result, throughput of the ashing step can be improved. Preferably the microwave generating power should be set more than 1500 W to increase the ashing rate.

Since the cation and the electron included in the plasma are not included in the oxygen radical, the semiconductor substrate, the oxide film, and other layers are never damaged, unlike the ashing including the cation and the electron.

An amount of the radical of the element used for the ashing can be adjusted by changing at least one of the microwave power, the flow rate of the gas, and the pressure. Such amount of the radical is increased much more as these parameters are increased higher.

As the reaction gas used in the above ashing, in addition to the above mixed gas, a mixed gas of $O_2$ and $CF_4$, a mixed gas of $O_2$, $CF_4$, and $N_2$, an oxygen mixed gas of $O_2$ and other gas, etc. may be employed.

In this case, it has become obvious empirically that, if $CF_4$ gas in the oxygen mixed gas is supplied at a 1.5 flow rate % or more, ashing of the deteriorated layer of the resist can be accelerated. If the flow rate of $CF_4$ is made excessively high, the oxide film on the surface of the semiconductor substrate is etched. Therefore, preferably such flow rate should be set to less than 6%.

If a nitrogen gas is included into the oxygen mixed gas at a 5 to 10 flow rate %, the ashing rate can be enhanced higher. Therefore, preferably such nitrogen gas should be included.

The ashing conditions are not limited to the above conditions. For example, the pressure in the ashing process may be set in the range of 0.5 to 2.0 Torr.

According to the present invention as described above, first the deteriorated layer (impurity including layer) formed on the surface of the resist is ashed by the smallest amount of the oxygen radical to make removal of the deteriorated layer possible and then remaining portion of the resist is ashed by the increased oxygen radical. As a consequence, while suppressing oxidation of the deteriorated layer on the surface of the resist, the ashing of the resist per se can be progressed and thus the deteriorated layer can be removed.

Since overall resist can be ashed by the oxygen radical without the cation and the electron, damage of the underlying layer of the resist can be prevented.

In addition, remaining portion of the resist can be removed at a high ashing rate by increasing the oxygen radical after the deteriorated layer on the surface of the resist has been removed, so that throughput of the ashing process can be improved.

What is claimed is:
1. An ashing method comprising the steps of:
   forming resist on a part of an underlying layer;
   ion-implanting elements into the underlying layer and the resist whereby a deteriorated layer including the ion-implanted elements is formed on a surface of the resist;
   placing the resist in radical atmosphere including oxygen radical of a first amount which suppresses oxidation of the ion-implanted elements in the deteriorated layer, and then ashing the deteriorated layer; and
   ashing remaining portion of the resist by increasing an amount of the oxygen radical in the radical atmosphere to a second amount which is larger than the first amount.
2. An ashing method according to claim 1, wherein the step of ashing the deteriorated layer of the resist and the step of ashing the remaining portion are executed in one chamber.
3. An ashing method according to claim 1, wherein the oxygen radical is generated by irradiating a microwave onto an oxygen-containing gas, and increase of the oxygen radical is executed by changing a power of the microwave.
4. An ashing method according to claim 3, wherein carbon fluoride is included in the oxygen-containing gas.
5. An ashing method according to claim 1, wherein increase in the oxygen radical is executed by increasing a flow rate of a gas for the oxygen radical.
6. An ashing method according to claim 1, wherein increase in the oxygen radical is executed by increasing a pressure of the radical atmosphere.
7. An ashing method according to claim 1, wherein increase in the oxygen radical is executed after the step of ashing the deteriorated layer has been completed.
8. An ashing method according to claim 1, further comprising the step of increasing a temperature of the underlying after the step of ashing the deteriorated layer has been completed.
9. An ashing method according to claim 8, wherein increase of the temperature is executed gradually.
10. An ashing method according to claim 8, wherein the temperature of the underlying layer is at least 150° C. by increasing the temperature.
11. An ashing method according to claim 1, wherein the deteriorated layer of the resist is ashed by making a temperature of the underlying layer lower than 150° C.
12. An ashing method according to claim 1, wherein the underlying layer is a semiconductor layer.
13. An ashing method according to claim 1, wherein the underlying layer is made of silicon.

* * * * *